US006987421B2

(12) United States Patent
Blanken (10) Patent No.: US 6,987,421 B2
(45) Date of Patent: Jan. 17, 2006

(54) COMMON MODE VOLTAGE GENERATION AT A DIFFERENTIAL OUTPUT OF AN AMPLIFIER

(75) Inventor: Pieter Gerrit Blanken, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 71 days.

(21) Appl. No.: 10/828,063

(22) Filed: Apr. 20, 2004

(65) Prior Publication Data

US 2005/0052213 A1    Mar. 10, 2005

(30) Foreign Application Priority Data

Apr. 23, 2003    (EP) ................... 03101105

(51) Int. Cl.
*H03F 3/45*    (2006.01)
*H03K 19/0175*    (2006.01)
(52) U.S. Cl. .................. 330/258; 330/253; 326/83
(58) Field of Classification Search ............... 330/253, 330/258; 326/83
See application file for complete search history.

(56) References Cited

U.S. PATENT DOCUMENTS 6,433,634 B2 *    8/2002    Blanken et al. ............. 330/253

2004/0239426 A1 *    12/2004    Miwa et al. ................. 330/259

* cited by examiner

*Primary Examiner*—Robert Pascal
*Assistant Examiner*—Jason Crawford
(74) *Attorney, Agent, or Firm*—Aaron Waxler (57) ABSTRACT

A common mode voltage generating circuit has a first and a second output terminal (O1, O2) to supply a common mode voltage (Vcm) to a differential output of an amplifier stage (AMP). A first FET (T1) and a second FET (T2) have interconnected drains, and both have a source coupled to a supply terminal (Vss). A third FET (T3) has a source coupled to the drain of T1, a drain coupled to O1 and to a gate of T1. A fourth FET (T4) has a source coupled to a drain of T2, a drain coupled to O2 and to a gate of T2. A fifth FET (T5) has a gate for receiving a first reference voltage (VI), and a sixth FET (T6) has a source coupled to the drain of T5, a drain receiving a current (2I) from a current source (CS4), wherein the drain and the gate of T6 are interconnected. T3, T4 and T6 have interconnected gates and are biased to operate in their saturation region. T1, T2 and T5 are biased to operate in their linear regions. The common mode voltage generating circuit further comprises a seventh FET (T7) with a source coupled to Vss, a drain coupled to the drain of T5, and with a gate which receives a second reference voltage (Vh). T7 is biased to operate in its linear region. Bipolar transistors may be used instead of FET's.

6 Claims, 5 Drawing Sheets

COMMON MODE VOLTAGE GENERATION AT A DIFFERENTIAL OUTPUT OF AN AMPLIFIER

The invention relates to a common mode voltage generating circuit, and to an integrated circuit comprising such a common mode voltage generating circuit.

U.S. Pat. No. 6,433,634 discloses a common mode voltage generating circuit which receives a reference voltage to supply a common mode voltage to differential outputs of an amplifier stage. The common mode voltage at the differential outputs is substantially equal to the reference voltage.

In an embodiment, a lowest voltage generating circuit generates a lowest possible voltage at which the common mode voltage generating circuit still operates correctly. This lowest possible voltage indicates the lowest voltage which may occur at the differential output. A diode is connected in series with a lowest voltage generating circuit. A current source generates a current through the diode. A series arrangement of resistors is arranged in parallel with the diode to obtain the reference voltage. The reference voltage is the average of the lowest voltage and the voltage at the anode of the diode. The common mode voltage generating circuit has a single input to receive the reference voltage which determines the common mode voltage as the minimum value plus an offset.

The resistors should have a high impedance such that the current of the current source is flowing substantially through the diode and not through the resistors. This resistor divider causes the tap to be high-ohmic which has the drawback that parasitic effects may disturb the operation of the circuit.

It is an object of the invention to provide a common mode voltage generating circuit which is able to generate a common mode voltage which is an average value of two input voltages with different levels which are freely selectable and which do not require high-ohmic resistors.

A first aspect of the invention provides a common mode voltage generating circuit as claimed in claim 1. A second aspect of the invention provides an integrated circuit comprising such a common mode voltage generating circuit as claimed in claim 6. Advantageous embodiments are defined in the dependent claims.

Figure 1:
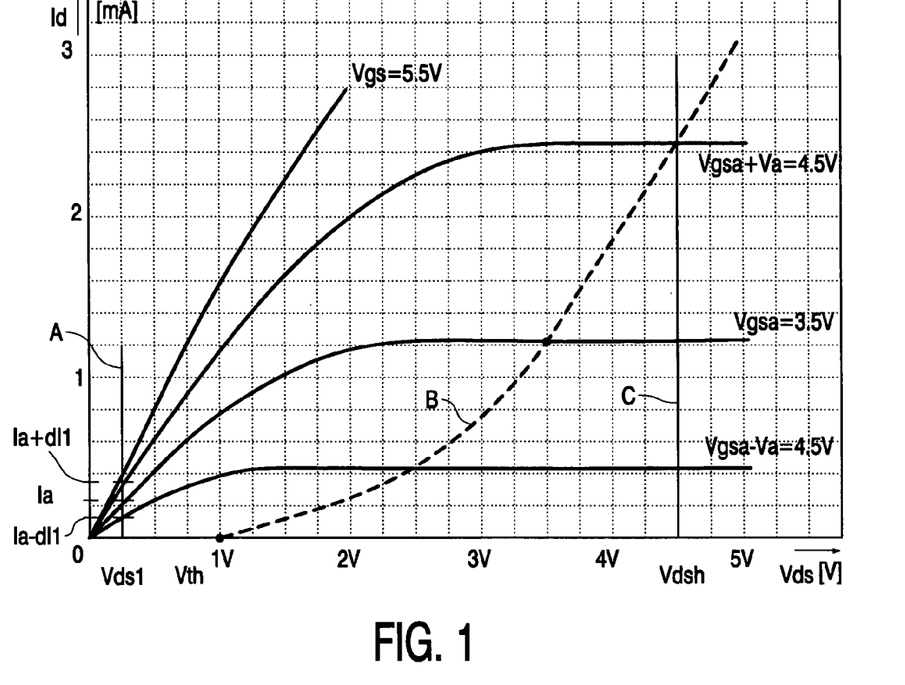
FIG. 1 shows well known current voltage characteristics of field effect transistors.
Figure 2:
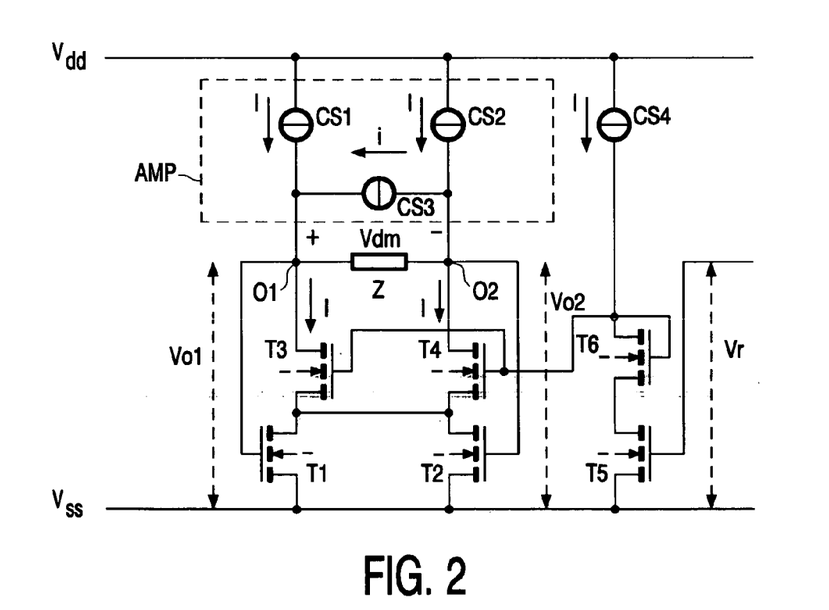
FIG. 2 shows a prior art common mode voltage generating circuit.

The operation of the prior art common mode voltage generating circuit which comprises the first to sixth transistors (which are field effect transistors in the prior art) is elucidated with respect to FIGS. 1 and 2. Thus, based on this prior art circuit only, the common mode voltage would be equal to the first reference voltage indicating the lowest voltage. The common mode voltage generating circuit in accordance with the first aspect of the invention further comprises a seventh transistor which has a first main electrode (the source for a field effect transistor, the emitter for a bipolar transistor) coupled to the supply terminal, a second main electrode (the drain for a field effect transistor or the collector for a bipolar transistor) coupled to the first main electrode of the fifth transistor, and a control electrode (the gate for a field effect transistor or the base for a bipolar transistor) which receives the second reference voltage. The seventh transistor is biased to operate in its linear region. As will be elucidated with respect to FIG. 3, this has the effect that the common voltage at the output terminals will become the average of the first and the second reference voltage. Thus, the common mode voltage generating circuit now comprises two inputs which receive the first and the second reference voltage and wherein the common mode voltage is the average value of the first and the second reference voltage. The first and the second reference voltage can be freely selected and no high ohmic resistors are required. If the field effect transistors are symmetrical, the source and the drain can be interchanged.

U.S. Pat. No. 6,433,634 discloses in another embodiment a lowest voltage generating circuit. An additional voltage is determined by a resistor connected to an output of the lowest voltage generating circuit and a current through this resistor. The reference voltage is the sum of the lowest voltage and the additional voltage. The common mode voltage will be equal to this sum value. Thus, the common mode voltage circuit has a single input for receiving a single sum voltage which determines the common mode voltage.

In an embodiment as defined in claim 4, the first reference voltage is the lowest voltage allowed at the output terminals, and the second reference voltage is the highest voltage allowed at the output terminals. This provides an optimal common mode voltage which has a value centered between this lowest and highest possible voltage allowed at the output terminals.

As the lowest voltage is determined by the construction of the common mode voltage generating circuit, this voltage can easily be generated. A preferred embodiment of the generation of the lowest voltage is defined in claim 3.

As the highest voltage is determined by the construction of the amplifier stage, it is not possible to accurately determine this highest voltage by generating a second reference voltage which is based on the first reference voltage too. Thus, the generation of the single reference voltages in accordance with the prior art U.S. Pat. No. 6,433,634 which are based on both the lowest voltage and a voltage obtained by adding a voltage to the lowest voltage (either by a current through a resistor or a diode) does not provide two independent reference voltages which are averaged by the common mode voltage generating circuit.

The construction of the common mode voltage generating circuit which has two inputs to receive the first and the second reference voltage and which determines a common mode voltage which is the average of the first and the second reference voltage allows inputting two independent reference voltages. One of the reference voltages may be the lowest voltage which is directly defined by the lowest possible voltage at which the common mode voltage generating circuit still operates correctly. The other reference voltage may be the highest voltage at which the amplifier stage still operates correctly. The common mode voltage generating circuit determines the average value of these two reference voltages without requiring resistors.

The last mentioned reference voltage is determined without a link to the first reference voltage. A preferred embodiment of an amplifier stage and a circuit for determining the last mentioned reference voltage is defined in claim 5. Preferably, the transistors are field effect transistors.

These and other aspects of the invention are apparent from and will be elucidated with reference to the embodiments described hereinafter.

FIG. 1 shows well known current voltage characteristics of field effect transistors. The drain current Id as function of the drain-source voltage Vds is shown for a number of values of the gate-source voltage Vgs of a field effect transistor. For a particular gate-source voltage Vgs, the characteristic starts at zero values of both Id and Vds. With increasing values of the drain-source voltage Vds, the drain current Id rises substantially parabolically during the first part of the characteristic and stabilizes at a substantial constant value. The saturation region of the field effect transistor is the part of the characteristic during which the substantial constant drain current Id flows. The rest of the characteristic is called the linear region of the field effect transistor. If bipolar transistors are used, instead of referring to the linear region it is also said that the transistor is in its bottoming region, and the saturation region is often referred to as the active region. The embodiments are further elucidated when field effect transistors are used, the skilled person is well aware of how to adapt these embodiments if bipolar transistors are used.

Thus, with respect to field effect transistors, in the linear region, the drain current Id is determined by the equation $$Id=\beta*((Vgs-Vth)*Vds-0.5*Vds^2)$$

wherein Vth is the threshold voltage of the field effect transistor and $\beta$ is a constant determined by process technology and geometrical layout.

In the saturation region, the drain current Id is determined by the equation $$Id=0.5*\beta*(Vgs-Vth)^2.$$

Thus, at a fixed drain to source voltage Vds, the drain current Id is linearly dependent on the gate-source voltage Vgs in the linear region, and is quadratically dependent on the gate-source voltage Vgs in the saturation region.

The line A in the linear region indicates that at a predetermined low value Vdsl of the drain-source voltage Vds and at a predetermined value of the gate source voltage Vgsa (3.5 V), the drain current Id is equal to Ia. If the gate-source voltage Vgs is increased with a particular value Va at this predetermined low value Vdsl of the drain-source voltage Vds, the drain current Id will increase with a value dI1. If the gate-source voltage Vgs is decreased with the particular value Va at the predetermined low value Vdsl of the drain-source voltage Vds, the drain current Id will decrease with the same value dI1.

The line B indicates the drain current Id dependency on the drain-source voltage Vds and the gate-source voltage Vgs if the field effect transistor is configured as a diode. The line B starts at the threshold voltage Vth.

The line C in the saturation region indicates that at a predetermined value Vdsh of the drain-source voltage a variation of the gate-source voltage Vgs causes a quadratic variation of the drain current Id.

FIG. 2 shows a prior art common mode voltage circuit. The common mode voltage generating circuit has a first output terminal O1 and a second output terminal O2 to supply a common mode voltage Vcm (not shown) to differential outputs of an amplifier stage AMP. The common mode voltage is the average value of the output voltages Vo1 and Vo2. By way of example, the amplifier stage AMP is modeled to comprise two current sources CS1 and CS2 which both supply a DC current I, and a current source CS3 which supplies an AC current i. The AC current i depends on the input signal of the amplifier stage AMP. An output impedance Z is present between the output terminals O1 and O2 to receive the AC current i. The output voltage Vdm of the amplifier stage AMP is present across the output impedance Z.

The common mode voltage generating circuit comprises field effect transistors T1 and T2 which have interconnected drains, and which both have a source connected to the supply terminal Vss. A field effect transistor T3 has a source connected to a drain of the field effect transistor T1, a drain connected to the first output terminal O1 and to a gate of the field effect transistor T1. A field effect transistor T4 has a source coupled to a drain of the field effect transistor T2, a drain coupled to the second output terminal O2 and to a gate of the field effect transistor T2. A field effect transistor T5 has a gate to receive a reference voltage Vr. A field effect transistor T6 has a source connected to the drain of the field effect transistor T5, and a drain receiving a current I from a current source CS4.

The drain and the gate of the field effect transistor T6 are interconnected. The field effect transistors T3, T4, T6 have interconnected gates and are biased to operate in their saturation region. The field effect transistors T1, T2, T5 are biased to operate in their linear region.

The operation of the known circuit shown of FIG. 2 is elucidated with respect to the characteristics of the field effect transistors shown in FIG. 1.

It is assumed that care is taken that the drain-source voltage across the field effect transistors (further referred to as transistors) T3, T4 and T6 is sufficient large to have these transistors T3, T4 and T6 operating in the saturation region. Thus if the gate voltage at these transistors T3, T4 and T6 is constant, a constant drain current Id will flow in the drains of these transistors T3, T4 and T6. The current in the diode arranged transistor T6 is equal to the current I supplied by the current source CS4. If the transistors T3, T4 and T6 are equal, the drain currents Id in the transistors T3 and T4 will be equal to the current I. Or said in another way, the transistors T3 and T4 operate as a current source sinking the current I.

Consequently, the AC current i will flow through the impedance Z and cause a voltage drop across this impedance Z dependent on the input signal(s) of the amplifier stage AMP. The resultant change of the output voltages Vo1 and Vo2 will not influence the value of the current I which is drawn by the transistors T3 and T4 because these transistors T3 and T4 are in saturation.

However, the variation of the output voltage Vo1 at the gate of the transistor T1, which operates in the linear region, will change the drain current of this transistor T1. And, in the same manner, the variation of the output voltage Vo2 at the gate of the transistor T2, which operates in the linear region, will change the drain current of this transistor T2. However the change of the drain currents of the transistors T1 and T2 must result in a total current which equals 2I because the parallel arranged drain-source paths of the transistors T1 and T2 should sink the two currents I flowing through the transistors T3 and T4. This means that if the drain current of the transistor T1 changes a particular amount, the drain current of the transistor T2 has to change the same particular amount but in the opposite direction. Because both the transistors T1 and T2 operate in the linear region this is achieved only if the gate voltages of the transistors T1 and T2 both change a predetermined equal amount but in opposite direction. Thus, due to the feedback of the output voltages Vo1 and Vo2 to the transistors T1 and T2, a variation of the AC current i will give rise to a change of the output voltage Vo1 which is as large as a change of the output voltage Vo2, but in the opposite direction. For example, if the AC current increases from zero to the value i, the voltage across the output impedance Z will become i*Z, the output voltage Vo1 will increase with an amount i*Z/2 and the output voltage Vo2 will decrease with an amount i*Z/2.

If the AC current is zero, the transistors T3, T4 and T6 are equal, and the transistors T1, T2 and T5 are equal, due to the symmetry of the circuit, both the output voltages Vo1 and Vo2 must have the same level as the reference voltage Vr. For example, if the series arrangement of the transistors T4 and T2 is compared with the series arrangement of the transistors T5 and T6, in both series arrangements the same current I is flowing. In the saturation region the same drain current can only flow if the gate-source voltages are the same. Thus through the transistors T2 and T5 flows the same drain current I, and the same drain-source voltages are present. Consequently, the gate-source voltages must be equal.

Figure 3:
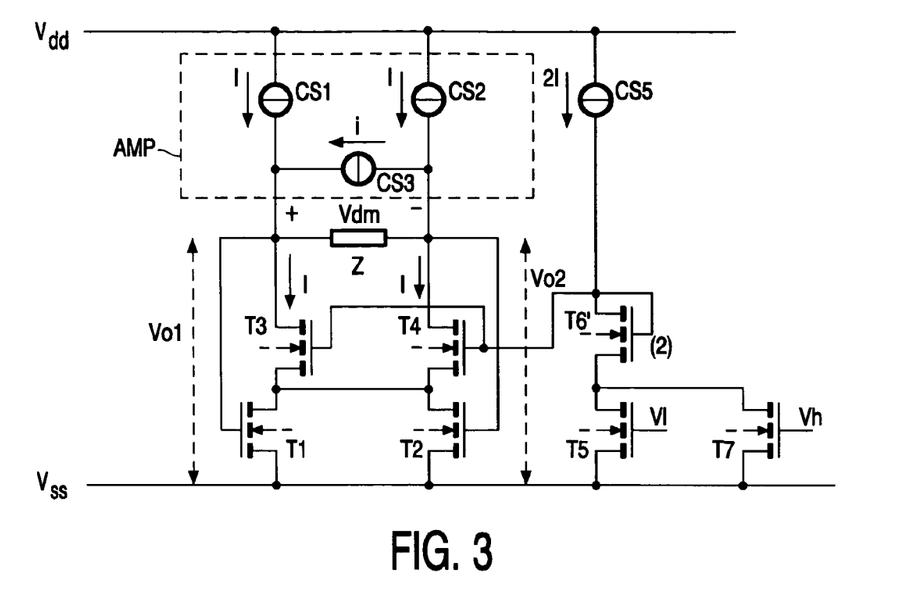
FIG. 3 shows an embodiment of a common mode voltage generating circuit in accordance with the invention.

FIG. 3 shows an embodiment of a common mode voltage circuit in accordance with the invention. The circuit shown in FIG. 3 is the circuit shown in FIG. 2 in which the current source CS4 which supplies the current I is replaced by the current source CS5 which supplies the current 2*I. The reference voltage Vr is now called the reference voltage Vl. And a transistor T7 has been added. The transistor T7 has a drain connected to the drain of transistor T5, a source connected to the source of transistor T5 and a gate for receiving the reference voltage Vh. The transistor T7 is operating in the linear region. Finally, the transistor T6 is replaced by the transistor T6' which has a double channel width.

Figure 5:
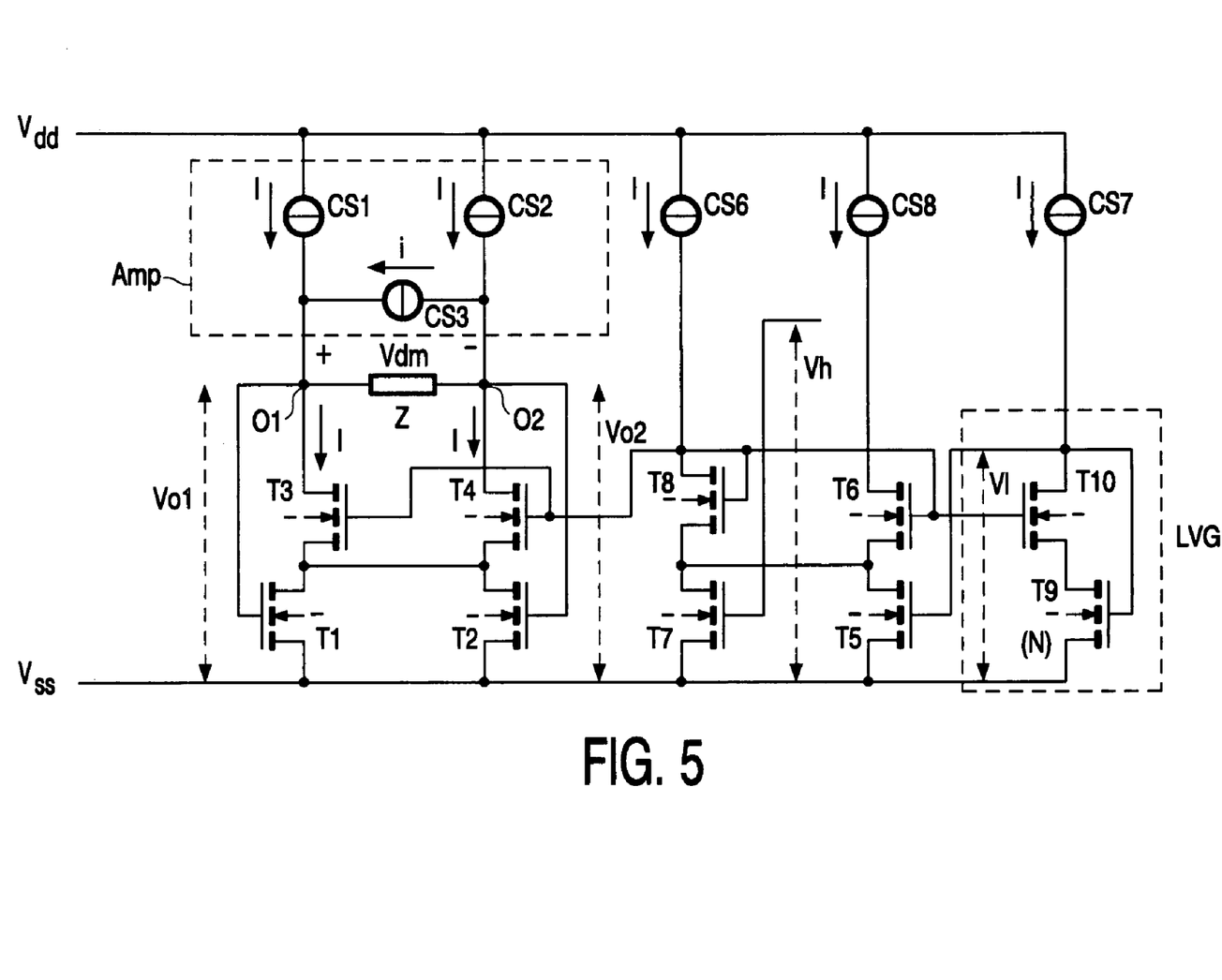
FIG. 5 shows another embodiment of the common mode voltage generating circuit in accordance with the invention.

Alternatively, as shown in FIG. 5, instead of the current source CS8 two current sources each supplying I may be used, the first one of these current sources (CS8 in FIG. 5) is connected to the drain of the transistor (T6 in FIG. 5 replaces T6' of FIG. 3) which now has the same channel width as the transistors T3 and T4. The second one of these current sources (CS6 in FIG. 5) is connected to a drain of a further transistor (T8 in FIG. 5) which is equal to the transistor T6. The further transistor has a source connected to the source of the transistor T6, a gate connected to the gate of the transistor T6, and a drain connected to the drain of the transistor T6.

The operation of the circuit is elucidated in the now following with respect to FIG. 3. The drain-source voltages of the transistors T5 and T7 are equal. The total drain currents of the transistors T5 and T7 must be equal to 2*I.

First, the theoretical situation is assumed that the reference voltages Vl and Vh are equal. The drain currents of both transistors T5 and T7 are equal to I. Due to the symmetry of the circuit, the same voltage must occur at the gates of the transistors T1 and T2 and thus the common mode voltage Vcm (Vcm=(Vo1+Vo2)/2) is equal to the level of the reference voltages Vl and Vh.

Now, the situation is assumed that the reference voltages Vl and Vh are different. Due to the fact that the total drain current through the transistors T5 and T7 must be equal to 2I, if the drain current of T5 decreases with an amount dI, then the drain current of T7 must increase with the amount dI. The drain-source voltage of both the transistors T5 and T7 has to shift until at the gate voltages supplied (which are the reference voltages Vl and Vh) this symmetrical drain current distribution occurs. The symmetrical current distribution occurs at the drain-source voltage which corresponds to the average voltage of the reference voltages as is elucidated with respect to an example shown in FIG. 4.

Figure 4:
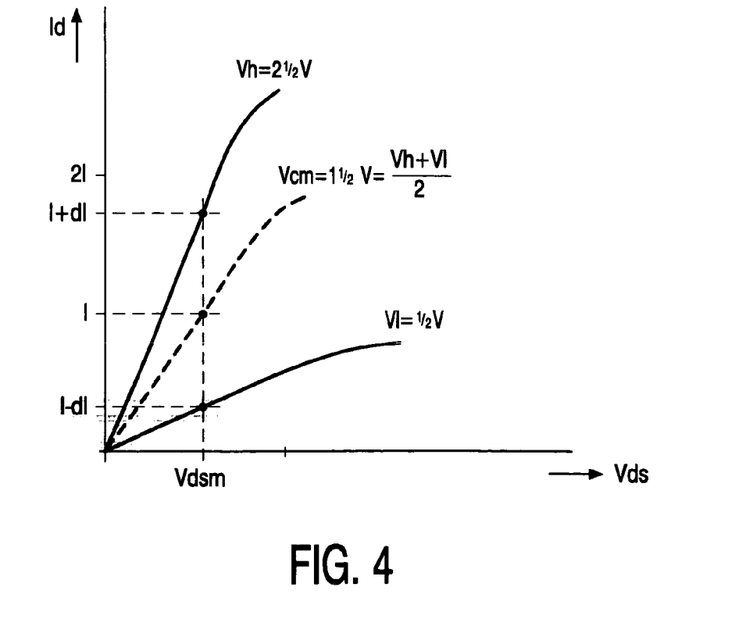
FIG. 4 shows the effect on the drain current at a fixed drain-source voltage of providing the two references voltages to the two inputs of the common mode voltage generating circuit.

FIG. 4 shows the effect on the drain current at a fixed drain-source voltage of providing the two references voltages to the two inputs of the common mode voltage generating circuit. In FIG. 4 only the linear region of the drain current Id as function of the drain-source voltage Vds is shown because the transistors T5 and T7 operate in the linear region. To each two different reference voltages Vl and Vh, which are the gate-source voltages of the transistors T5 and T7, respectively, a value Vdsm of the drain-source voltage exists at which the sum of the drain currents Id through the transistors T5 and T7 is equal to 2I. In the example shown in FIG. 4, Vh is 2.5 volts and Vl is 0.5 volts. As is clear from FIG. 4, as long as the drain current depends substantially linearly on the gate-source voltage, this causes a drain current I+dI through transistor T7 and a drain current I−dI through the transistor T5.

Due to the symmetry of the circuit, this same drain-source voltage Vdsm will be present across the transistors T1 and T2. If the current i is zero, and thus the drain current of both the transistors T1 and T2 is I, this drain-source voltage Vdsm at a drain current of I will give rise to a gate-source voltage Vcm of the transistors T1 and T2 which must be equal to the average level of the levels of the voltages Vl and Vh as becomes clear from FIG. 4.

Thus, by adding the transistor T7 with its main current path in parallel with the transistor T5 and by supplying the second different reference voltage Vh to the gate of the transistor T7, the common mode voltage generating circuit will generate a common mode voltage at the outputs O1 and O2 which is the average voltage of the two reference voltages Vl and Vh. These two reference voltages can be selected freely, and no resistors are required to combine the voltages.

FIG. 5 shows another embodiment of the common mode voltage circuit in accordance with the invention. The circuit shown in FIG. 5 is the circuit of FIG. 3 in which the current source CS5 which supplies the current 2I is replaced by the current source CS8 which supplies the current I. Further, the current sources CS6 and CS7, and the transistors T8, T9 and T10 are added. The transistor T8 has a source connected to the drain of transistor T7, a drain connected to the drain of the transistor T6 and a gate connected to the gate of transistor T6. The current source CS6 supplies a current I and is connected to the drain of transistor T8. The transistor T9 has a source connected to the supply Vss. The transistor T10 has a source connected to a drain of the transistor T9, a gate connected to the gate of transistor T6, and a drain connected to the gate of transistor T5 to supply the reference voltage Vl. The current source CS7 supplies a current I and is connected to the drain of transistor T10.

The transistors T10 and T8 operate in saturation, the transistor T9 operates in the linear region and has a channel width which is N times larger than the channel width of the transistors T1, T2, T5 and T7.

The two current sources CS8 and CS6 and the four transistors T5 to T8 operate in the same manner as the current source CS4 and the three transistors T5 to T7 of FIG. 3. The current source CS7 and the transistors T9 and T10 determine the lowest possible voltage Vl at which the common voltage generating circuit still operates because this factor N causes a drain current density through the transistor T9 which is approximately equal to the minimum drain current density through the transistors T1 or T2. The voltage Vl which occurs at this current density through the transistor T9 is thus the minimal voltage which may occur at the outputs O1 and O2. The common mode voltage Vcm at the outputs O1 and O2 has a value which is optimally centered between the lowest possible voltage and the highest possible voltage at the outputs, one of the reference voltages Vl should have this lowest possible voltage. The other reference voltage Vh is determined by the construction of the amplifier stage AMP. An embodiment of the amplifier stage AMP and of a circuit for determining the highest voltage allowed at the outputs O1 and O2 is elucidated with respect to FIG. 6.

Figure 6:
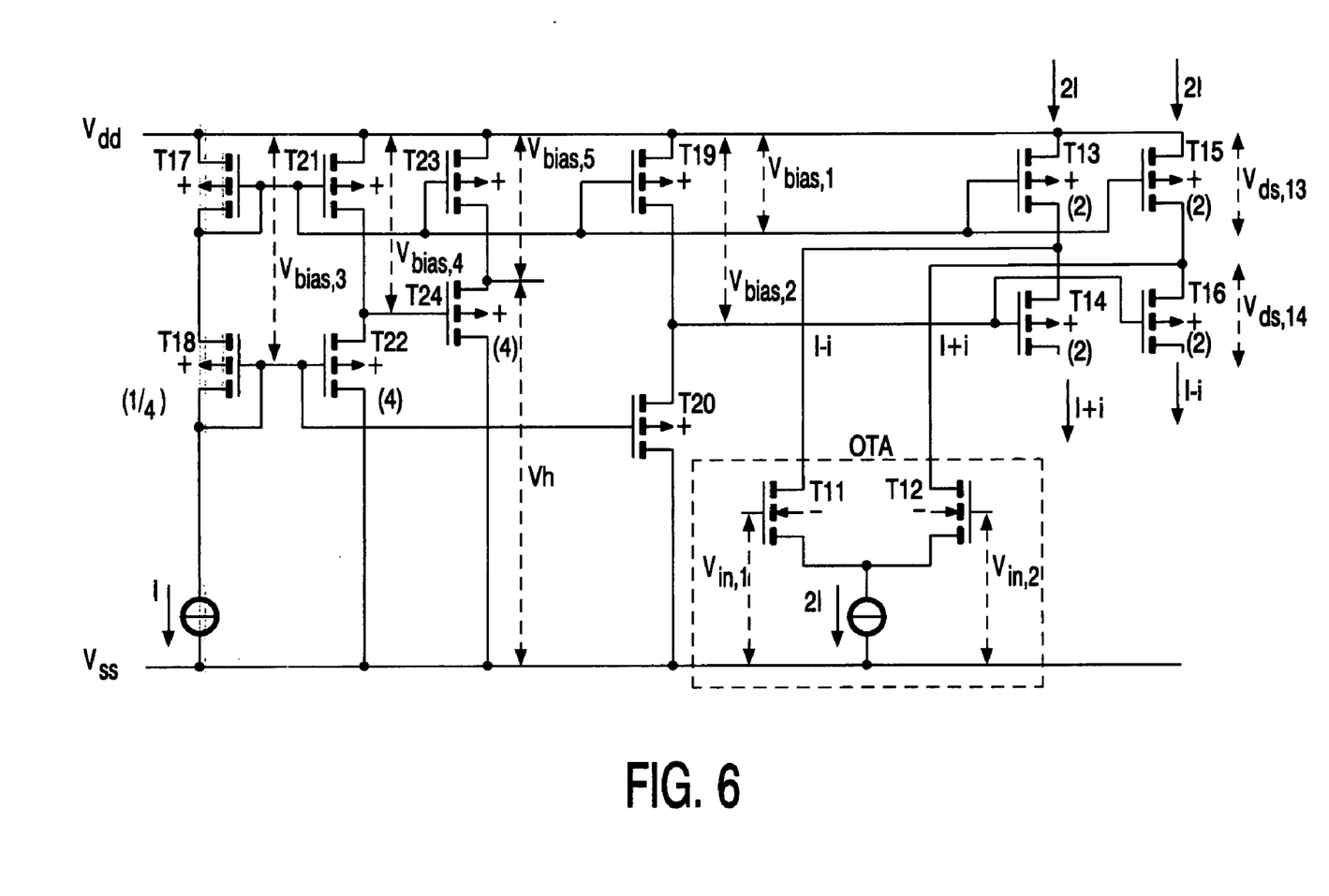
FIG. 6 shows an embodiment of an amplifier stage and the generation of the high reference value in accordance with the invention.

FIG. 6 shows an embodiment of an amplifier stage and the generation of the high reference value in accordance with the invention. The reference voltage Vh terminal of FIGS. 3 and 5 may be connected to a node with the highest voltage, ever to appear on either one of the output nodes of the differential amplifier. In order to maximize the output voltage headroom, the reference voltage Vh needs to be as close to the positive supply voltage as possible. A circuit for the generation of the reference voltage Vh cannot be given in general, because the level of the reference voltage Vh will depend on the transistor realization of the amplifier stage AMP. FIG. 6 shows an example of a possible realization of the amplifier stage AMP and the reference voltage Vh.

The value of the reference voltage Vh depends on the supply voltage, the threshold voltage, the gain factor, the layouts, the temperature, the bias current, and other process parameters of the applied IC technology, but always should be as close to the supply voltage Vdd as possible. This allows for easier design of a robust circuit.

An operational transconductance amplifier OTA, built with transistors T11 and T12 and a tail current source of value 2I, converts the differential input voltage Vin,1–Vin,2 between its inputs to output currents I–i and I+i, such that a differential output current i is flowing. These output currents I–i and I+i are input to a folded-cascode stage, built with transistors T13 ... T16. The transistors T13 and T15, which are biased by a gate-source voltage Vbias,1 developed across diode-connected transistor T17 which is biased at a drain current I, are operating as current sources. The transistors T17, T19, T21, T23 have identical layout, and the transistors T13, T15 each consist of two of such transistors in parallel. This is indicated in FIG. 6 by the notation (2) next to the transistor symbol. The result is that transistors T13 and T15 each conduct a drain current 2I, and that the folded-cascode output transistors T14 and T16 conduct output currents I+i and I–i respectively, provided that they are biased in their saturation regions.

The drains of transistors T14 and T16 are the outputs of the amplifier stage AMP. To make sure that the amplifier stage AMP output voltages can get as close to the positive supply voltage Vdd as possible, while maintaining operation in the saturation region of T14 and T16, it is necessary that the bias voltage Vbias,2 is as small as possible. This is accomplished by a prior-art technique, disclosed in T. C. Choi, R. T. Kaneshiro, R. W. Brodersen, P. R. Gray, W. B. Jett, M. Wilcox, "High-Frequency CMOS Switched-Capacitor Filters for Communications Application", IEEE J. Solid-State Circuits, vol. 18no. 6, December 1983, pp. 652–664, specifically in FIG. 15 of this article. The technique is elucidated in the now following.

An enhancement MOS transistor in strong inversion is biased in its saturation region when the absolute value of its drain-source voltage Vds is larger than the absolute value of its gate-source voltage Vgs minus an absolute threshold voltage Vth, so $$|V_{ds}| \geq |V_{gs}| - |V_{th}| = |V_{gt}| \qquad (1)$$

or $$|V_{dg}| \geq -|V_{th}| \qquad (2)$$

wherein Vgt=Vgs–Vth is the so-called gate drive voltage, and Vdg is the drain gate voltage. For an nMOS transistor this means that the drain voltage may decrease to |Vth| below the gate voltage, while for a pMOS transistor it means that the drain voltage may increase to |Vth| above the gate voltage.

The bias voltage Vbias,1 is equal to the absolute value of T17's gate-source voltage $$V_{bias,1} = |V_{gs,17}| = |V_{th}| + |V_{gt,17}| \qquad (3)$$

The current-source transistors T13 and T15 are biased in their saturation regions when the absolute values of their drain-source voltages is larger than |Vgt,13|= |Vgt,15|=|Vgt,17|. Drain-source voltage |Vds,13| is determined by the gate-source voltage |Vgs,14| of cascode transistor T14 and the value of the bias voltage Vbias,2. The number after the voltage indicates the transistor which has this number, for example, Vds,13 is the drain-source voltage of transistor T13.

$$|V_{ds,13}| = V_{bias,2} - |V_{gs,14}| = V_{bias,2} - |V_{th}| - |V_{gt,14}| \qquad (4)$$

The bias voltage Vbias,2 is generated by transistors T17, T18, and T20. The transistors T14, T16, T18, T20 and T22 are built up of unit transistors, the layout of which is not necessarily equal to the unit transistor in the T13, T15, T17, T19, T21, T23 set of transistors. For bias voltage Vbias,2 we can write $$V_{bias,2} = |V_{gs,17}| + |V_{gs,18}| - |V_{gs,20}| = |V_{th}| + |V_{gt,17}| + |V_{th}| + |V_{gt,18}| - |V_{th}| - |V_{gt,20}| \qquad (5)$$

By designing transistor T18 to have a current density (current per unit channel width) which is four-fold larger than that of transistor T20, and assuming a quadratic dependence of drain-current on gate drive voltage, the gate drive voltage |Vgt,18| of transistor T18 is two-fold larger than the gate drive voltage |Vgt,20| of transistor T20. Thus $$V_{bias,2} = |V_{th}| + |V_{gt,17}| + |V_{gt,20}| \qquad (6)$$

As the current density of transistor T14 at maximum is equal to that of transistor T20, namely in case that I+i=2I, we get $$V_{gt,14} \leq |V_{gt,20}| \qquad (7)$$

Substitution of equations (6) and (7) into equation (4) yields $$|V_{ds,13}| \geq |V_{gt,17}| \qquad (8)$$

A similar reasoning for T15 yields $$|V_{ds,15}| \geq |V_{gt,17}| \qquad (9)$$

Equations (8) and (9) lead to the conclusion that current-source transistors T13 and T15 indeed are biased in their saturation regions.

The bias voltage Vbias,5 is generated by transistors T17, T18, T22 and T24.

$$V_{bias,5} = |V_{gs,17}| + |V_{gs,18}| - |V_{gs,22}| - |V_{gs,24}| \qquad (10)$$

The source-follower transistors T22 and T24 are designed to have a fourfold smaller current density than transistor T20 so $$|V_{gt,22}| = |V_{gt,24}| = \frac{1}{2}|V_{gt,20}| \quad (11)$$

The bias voltage Vbias,5 thus is $$V_{bias,5} = |V_{gt,17}| + |V_{gt,20}| \quad (12)$$

From equation (6) we have $$V_{bias,2} = |V_{th}| + |V_{gt,17}| + |V_{gt,20}| \quad (13)$$

Thus, the node voltage Vh at the source of transistor T24 is one threshold voltage |Vth| higher than the gate voltage of T14 and T16. This implies that voltage Vh indicates the highest possible voltage on either one of the drains of T14 and T16, while keeping T14 and T16 in saturation. Consequently, this voltage Vh can be used optimally as the reference voltage Vh.

Figure 7:
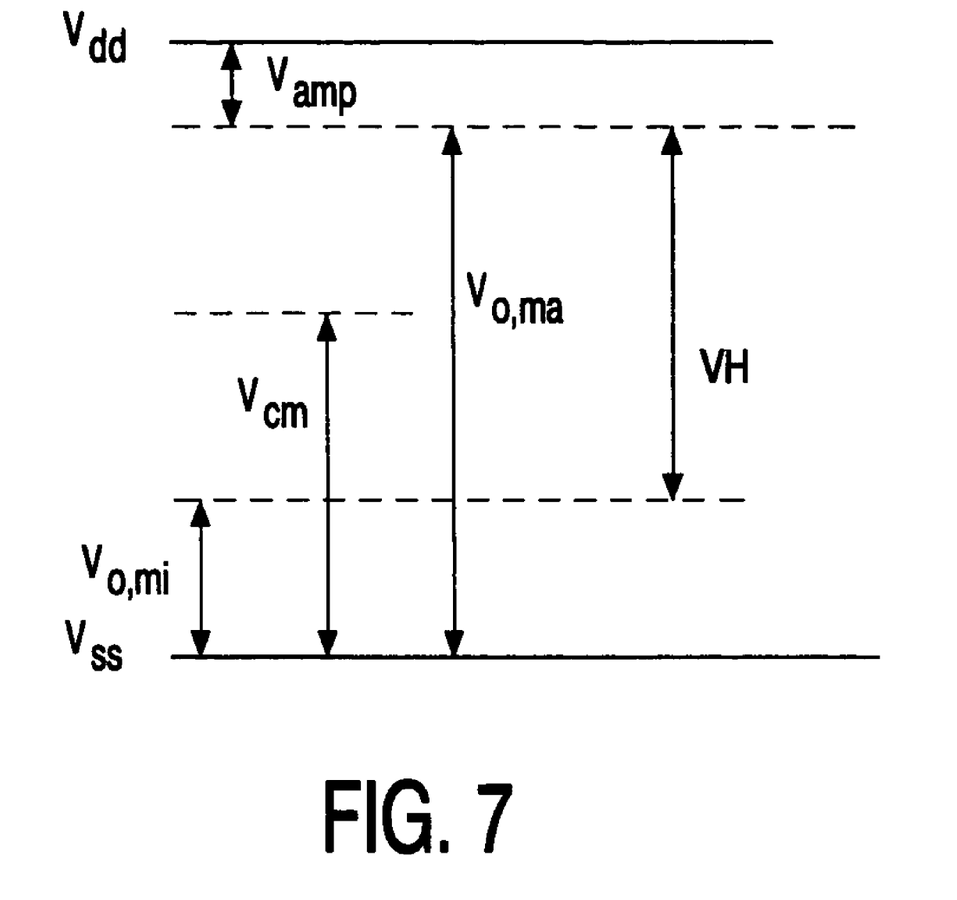
FIG. 7 shows an example of the voltage headroom in a circuit.

FIG. 7 shows an example of the voltage headroom in a circuit. The power supply voltages are Vdd and Vss. Usually, Vss is ground. Vo,mi indicates the minimum voltage required by the common-mode voltage generating circuit to operate correctly. Vamp indicates the voltage which is required by the amplifier stage to operate correctly. VH indicates the voltage headroom for the output voltage Vcm wherein the output voltages at the outputs O1 and O2 may vary. If one of the output voltages leaves the headroom, either the amplifier stage AMP or the common-mode voltage generating circuit will not operate correctly any more. The common mode voltage Vcm at the outputs O1 and O2 is selected optimally if its level is centered in the voltage headroom area. Thus, the common mode voltage Vcm should be the average between the minimal allowable voltage Vo,mi across the common voltage generating circuit and the maximal allowable voltage Vo,ma at which the voltage Vamp across the amplifier stage AMP is minimal.

In the embodiments of U.S. Pat. No. 6,433,634 the common mode voltage Vcm is defined as an offset with respect to the minimal allowable voltage Vo, mi and thus does not take care of the correct determination of the maximal allowable voltage Vo,ma. The common mode voltage Vcm will thus not be optimally centered between these minimal and maximal allowable voltages.

It should be noted that the above-mentioned embodiments illustrate rather than limit the invention, and that those skilled in the art will be able to design many alternative embodiments without departing from the scope of the appended claims. For example, the saturated transistors (for example transistors T3, T4 and T6 in FIG. 3) may be replaced by a cascode of saturated transistors. It is also possible to replace the p-conductivity type transistors by n-conductivity type transistors, provide all n-conductivity type transistors are replaced by p-conductivity type transistors at the same time, the polarities of the power supplies are interchanged, the currents in the current sources are poled in the other direction, and other adaptations well known to the skilled person. The electronic circuit preferably is used in an integrated circuit, it may alternatively be composed from discrete components.

The equations used are simplification of the real behavior of the transistors, but the operation of the embodiments in practice will only slightly deviate from the explanation of their operation based on these equations. The transistors may be also be bipolar transistors.

In the claims, any reference signs placed between parentheses shall not be construed as limiting the claim. The word "comprising" does not exclude the presence of other elements or steps than those listed in a claim. The invention can be implemented by means of hardware comprising several distinct elements, and by means of a suitably programmed computer. In the device claim enumerating several means, several of these means can be embodied by one and the same item of hardware.

What is claimed is:

1. A common mode voltage generating circuit for supplying a common mode voltage (Vcm) to a first and a second output terminal (O1, O2) forming differential outputs of an amplifier stage (AMP), the common mode voltage generating circuit comprises:
    a first transistor (T1) and a second transistor (T2) having interconnected first main electrodes, and both having a second main electrode coupled to a supply terminal (Vss),
    a third transistor (T3) with a second main electrode coupled to a first main electrode of the first transistor (T1), and a first main electrode coupled to the first output terminal (O1) and to a control electrode of the first transistor (T1),
    a fourth transistor (T4) with a second main electrode coupled to a first main electrode of the second transistor (T2), and a first main electrode coupled to the second output terminal (O2) and to a control electrode of the second transistor (T2),
    a fifth transistor (T5) with a control electrode for receiving a first reference voltage (Vr; Vl), and
    a sixth transistor (T6) having a second main electrode coupled to the first main electrode of the fifth transistor (T5), and a first main electrode for receiving a current (2I) from a current source (CS4), the first main electrode and the control electrode of the sixth transistor (T6) being interconnected, the third, the fourth and the sixth transistors (T3, T4, T6) having interconnected control electrodes and being biased to operate in their saturation region, the first, second and fifth transistors (T1, T2, T5) being biased to operate in their linear region, wherein
    the common mode voltage generating circuit further comprises a seventh transistor (T7) with a second main electrode coupled to the supply terminal (Vss), a first main electrode coupled to the first main electrode of the fifth transistor (T5), and a control electrode for receiving a second reference voltage (Vh), the seventh transistor (T7) being biased to operate in its linear region, and wherein
    the first main electrode is a collector and the second main electrode is an emitter for bipolar transistors, and the first main electrode and the second main electrode are a drain and a source, respectively, or the other way around, for field effect transistors.

2. A common mode voltage generating circuit as claimed in claim 1, further comprising a lowest voltage level generating circuit (LVG) for generating the first reference voltage (Vl) being the lowest possible voltage allowable on the differential output of the amplifier stage (AMP) to obtain a correct operation of the common mode voltage generating circuit.

3. A common mode voltage generating circuit as claimed in claim 2, wherein the lowest voltage level generating circuit (LVG) comprises:
    an eighth transistor (T9) with a second main electrode coupled to the supply terminal (Vss), and
    a ninth transistor (T10) with a second main electrode coupled to a first main electrode of the eighth transistor (T9), a control electrode coupled to the control electrode of the sixth transistor (T6), and a first main electrode coupled (i) to a control electrode of the eighth transistor (T9), (ii) to a control electrode of the fifth transistor (T5) for supplying the first reference voltage (Vl), and (iii) to a current source (CS5) for receiving a current (I).

4. A common mode voltage generating circuit as claimed in claim 1, further comprising a highest voltage level generating circuit (HVG) for generating the second reference voltage (Vh) being the highest possible voltage allowable on the differential output of the amplifier stage (AMP) to obtain a correct operation of the amplifier stage (AMP).

5. A common mode voltage generating circuit as claimed in claim 4, wherein the amplifier stage (AMP) comprises
   an output stage comprising a first series arrangement of two transistors (T13, T14) coupled between a supply voltage (Vdd) and one of the differential outputs of the amplifier stage (AMP),
   a first biasing circuit (T17, T18) for supplying a first biasing voltage (Vbias,1) to a control electrode of the transistor (T13) of the output stage coupled to the supply voltage (Vdd), and
   a second series arrangement of two transistors (T19, T20) coupled between the supply voltage (Vdd) and a further supply voltage (Vss), and having a junction for supplying a second biasing voltage (Vbias,2) to a control electrode of the other transistor (T14) of the output stage,
and wherein the highest voltage level generating circuit (HVG) comprises
   a third series arrangement of two series connected transistors (T23, 24) coupled between the supply voltage (Vdd) and the further supply voltage (Vss), and having a junction for supplying the second reference voltage (Vh), a control electrode of the transistor (T23) of the third series arrangement being coupled to the supply voltage (Vdd) being connected to receive the first biasing voltage (Vbias,1), and
   a fourth series arrangement of two series connected transistors (T21, 22) coupled between the supply voltage (Vdd) and the further supply voltage (Vss), and having a junction for supplying a third biasing voltage (Vbias,4) to a control electrode of the transistor (T24) of the third series arrangement being coupled to the further supply voltage (Vss),
wherein the transistors (T19, T21) coupled to the supply voltage (Vdd) of both the second and the fourth series arrangement have identical current densities, and the transistor (T22) of the fourth series arrangement being coupled to the further supply voltage (Vss) has a current density which is one-fourth of the current density of the transistor (T20) of the second series arrangement being coupled to the further supply voltage (Vss), the transistors (T13, T14, T15, T16) of the output stage having a current density which in balanced situation is identical to the current density of the transistor (T20) of the second series arrangement being coupled to the further supply voltage (Vss), the transistor (T24) of the third series arrangement having a current density which is one-fourth of the current density of the transistor (T20) of the second series arrangement.

6. An integrated circuit comprising the common mode voltage generating circuit as claimed in claim 1.

* * * * *